(12) United States Patent
Koda et al.

(10) Patent No.: US 12,337,392 B2
(45) Date of Patent: Jun. 24, 2025

(54) COATED TOOL AND CUTTING TOOL INCLUDING THE SAME

(71) Applicant: KYOCERA CORPORATION, Kyoto (JP)

(72) Inventors: Risa Koda, Satsumasendai (JP); Masahiro Waki, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 460 days.

(21) Appl. No.: 17/999,926

(22) PCT Filed: May 24, 2021

(86) PCT No.: PCT/JP2021/019603
§ 371 (c)(1),
(2) Date: Nov. 27, 2022

(87) PCT Pub. No.: WO2021/241499
PCT Pub. Date: Dec. 2, 2021

(65) Prior Publication Data
US 2023/0234144 A1 Jul. 27, 2023

(30) Foreign Application Priority Data

May 28, 2020 (JP) ................................. 2020-093451

(51) Int. Cl.
| B32B 27/20 | (2006.01) |
| B23B 27/20 | (2006.01) |
| B23C 5/22 | (2006.01) |

(52) U.S. Cl.
CPC ............... *B23B 27/20* (2013.01); *B23C 5/22* (2013.01)

(58) Field of Classification Search
CPC ....... B23B 27/20; B23C 5/22; C23C 16/0272; C23C 16/27
See application file for complete search history.

(56) References Cited

U.S. PATENT DOCUMENTS

| 6,082,936 A | 7/2000 | Moriguchi et al. |
| 2019/0134721 A1 | 5/2019 | Waki |

FOREIGN PATENT DOCUMENTS

| JP | H3190605 A | 8/1991 |
| JP | H1071507 A | 3/1998 |
| JP | 201070405 A | 4/2010 |
| JP | 2011104772 A | 6/2011 |
| WO | 2017188154 A1 | 11/2017 |

*Primary Examiner* — Lawrence D Ferguson
(74) *Attorney, Agent, or Firm* — HAUPTMAN HAM, LLP

(57) ABSTRACT

A coated tool includes a base body and a diamond coating. The coated tool has a cutting edge. The first surface comprises a first region close to the cutting edge and a second region further away from the cutting edge than the first region. The diamond coating comprises an outer surface having dome-shaped protrusions. The protrusions include first protrusions having an equivalent circle diameter of 6 μm or more located in the first region, and second protrusions having an equivalent circle diameter of 6 μm or more located in the second region. A number of the first protrusions per 1 $mm^2$ is a first protrusion number. A number of the second protrusions per 1 $mm^2$ is a second protrusion number. The first protrusion number is 30 or less, and the second protrusion number is larger than the first protrusion number.

4 Claims, 5 Drawing Sheets

COATED TOOL AND CUTTING TOOL INCLUDING THE SAME

RELATED APPLICATIONS

The present application is a National Phase of International Application Number PCT/JP2021/019603 filed May 24, 2021, which claims the benefit of priority from Japanese Patent Application No. 2020-093451, filed on May 28, 2020.

TECHNICAL FIELD

The present disclosure relates to a coated tool used in a cutting process, and a cutting tool including the coated tool.

BACKGROUND

Japanese Unexamined Patent Publication No. 3-190605 (Patent Document 1) discusses that a surface of a diamond-coated cutting tool is smoothened with a polishing brush. Japanese Unexamined Patent Publication No. 2010-70405 (Patent Document 2) discusses a poly-crystalline diamond film formed after seeding treatment of diamond powder on a base body, in which the number of abnormally grown diamond protrusions on a surface of the diamond film is controlled to 100 pieces or less per 1 $cm^2$.

SUMMARY

A coated tool of the present disclosure includes a base body and a diamond coating located on the base body. The coated tool has a first surface, a second surface, a ridgeline part located between the first surface and the second surface, and a cutting edge on at least a part of the ridgeline part. A region on the first surface from the cutting edge to a point located 300 μm away from the cutting edge is a first region. Using the cutting edge as a starting point, a region from the cutting edge to a point located 300-800 μm away from the cutting edge is a second region. The diamond coating is located on at least the first region and the second region. A plurality of dome-shaped protrusions are present on a surface of the diamond coating. As viewed from directly above the first region, protrusions having an equivalent circle diameter of 6 μm or more located in the first region are first protrusions, and a number of the first protrusions per 1 $mm^2$ is a first protrusion number. As viewed from directly above the second region, protrusions having an equivalent circle diameter of 6 μm or more located in the second region are second protrusions, and a number of the second protrusions per 1 $mm^2$ is a second protrusion number. The first protrusion number is 30 or less. The second protrusion number is larger than the first protrusion number. A cutting tool of the present disclosure includes a holder which has a length from a first end to a second end and includes a pocket located on a side of the first end, and the coated tool located in the pocket.

EMBODIMENT

<Coated Tools>

Figure 1:
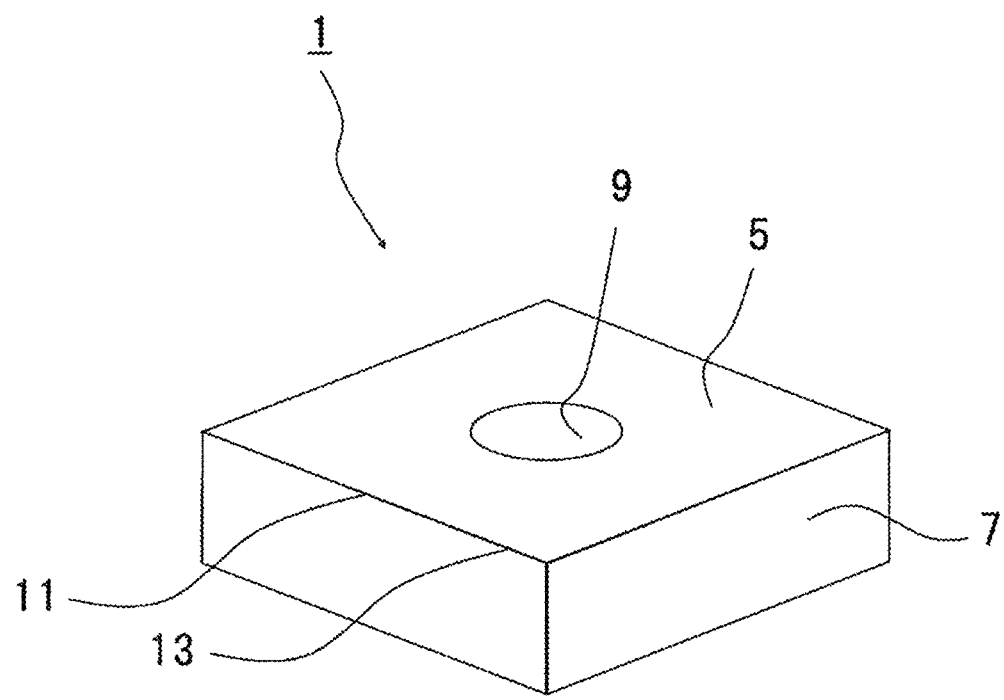
FIG. 1 is a perspective view illustrating an embodiment of coated tools in the present disclosure.

Coated tools of the present disclosure are described in detail below with reference to the drawings. For convenience of description, each of the drawings referred to in the following illustrates, in simplified form, only main members necessary for describing embodiments. The coated tools of the present disclosure may therefore include any arbitrary structural member not illustrated in the drawings referred to. Dimensions of the members in each of the drawings faithfully represent neither dimensions of actual structural members nor dimensional ratios of these members. These points are also true for cutting tools described later.

The coated tool 1 of the present disclosure may have, for example, a quadrangular plate shape as illustrated in FIG. 1. A first surface 5 that is an upper surface in FIG. 1 is a so-called rake surface. The coated tool 1 has a second surface 7 that is a lateral surface connecting to the first surface 5. The second surface 7 is a so-called flank surface.

The coated tool 1 has a third surface (not illustrated) that is a lower surface located on a side opposite to the first surface 5. The second surface 7 connects to each of the first surface 5 and the third surface.

The coated tool 1 of the present disclosure may have a through hole 9 that penetrates through the base body 15 from the first surface 5 to the third surface.

The coated tool 1 of the present disclosure has a cutting edge 13 located on at least a part of a ridgeline 11 (ridgeline part) where the first surface 5 intersects with the second surface 7. In other words, the coated tool 1 has the cutting edge 13 located on at least a part of the ridgeline 11 where the rake surface intersects with the flank surface.

Although the whole of an outer periphery of the first surface 5 is the cutting edge 13 in the coated tool 1, the coated tool 1 is not limited to this configuration. For example, the coated tool 1 may have the cutting edge 13 only on one side of the quadrangular rake surface, or may have the cutting edge 13 as part of the rake surface. Alternatively, the coated tool 1 of the present disclosure may have a drill shape.

Figure 2:
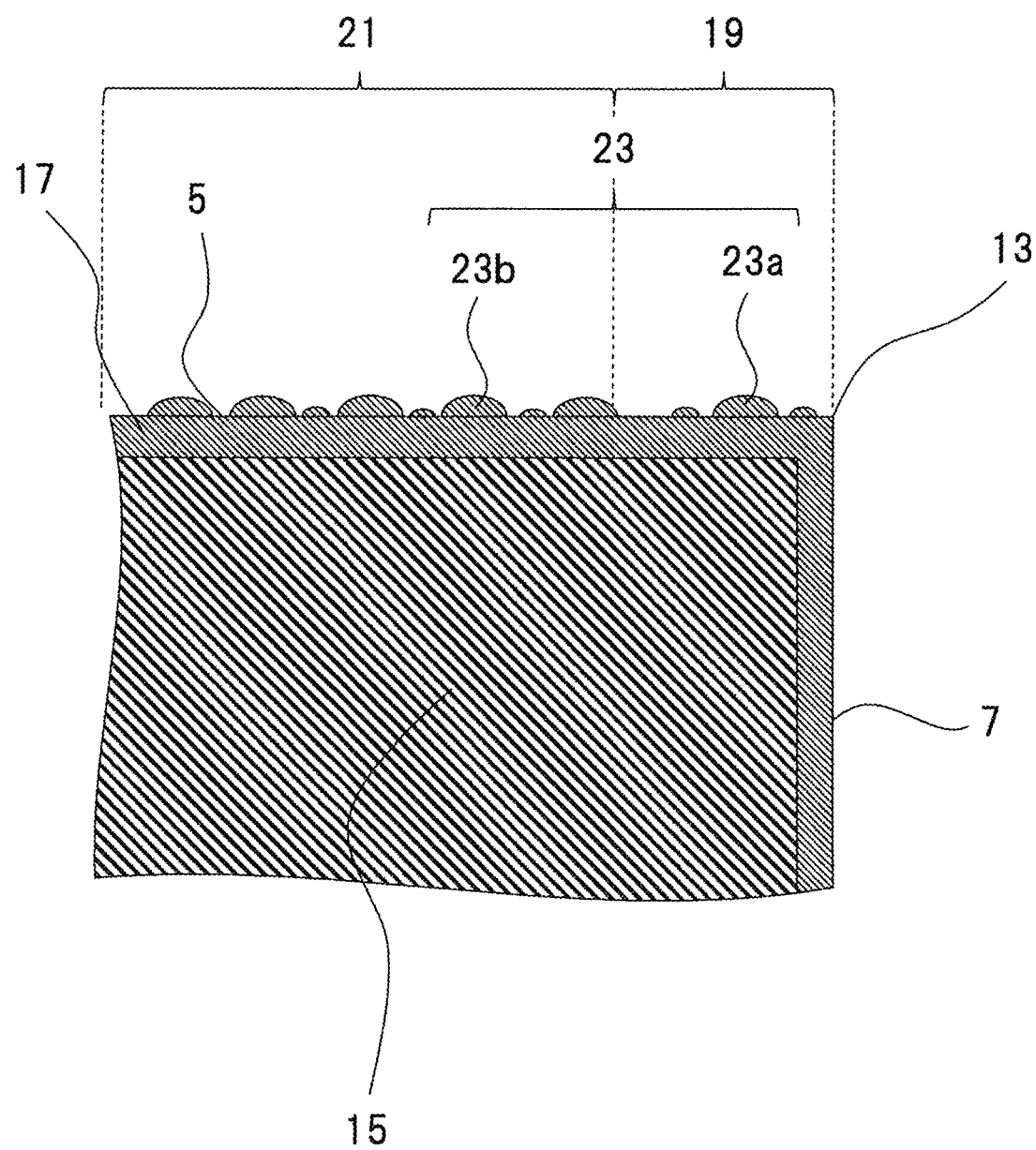
FIG. 2 is a schematic diagram in a cross section illustrating an embodiment of the coated tools in the present disclosure.

The following is a description of the coated tool 1 having, for example, a rectangular shape illustrated in FIG. 1. FIG. 2 is a schematic diagram of a cross section of the coated tool 1. The cross section of FIG. 2 is a cross section perpendicular to a surface of the base body 15 in the coated tool 1 of the present disclosure. A diamond coating 17 (diamond layer) is located on the base body 15. The base body 15 may be, for example, cemented carbide.

The cutting edge 13 on the first surface 5 is used as a starting point in the coated tool 1 of the present disclosure. A region from the cutting edge 13 to a point located 300 μm away from the cutting edge 13 is a first region 19. Also using the cutting edge 13 as the starting point, a region from the cutting edge 13 to a point located 300-800 μm away from the cutting edge 13 is a second region 21. In the above definition of the first region 19, the phrase that "to a point located 300 μm away" means not including the point of 300 μm.

The diamond coating 17 is located on at least the first region 19 and the second region 21. A plurality of dome-shaped protrusions 23 are present on a surface of the diamond coating 17. As used herein, the term "dome-shaped protrusions 23" need not have a circle shape if the protrusions are viewed from above, but has no intention of excluding polygonal-shaped ones. In a cross-sectional view of the protrusions 23 as illustrated in FIG. 2, a diameter of each of the protrusions 23 may be larger than a height of each of the protrusions 23. In the cross-sectional view of the protrusions 23, the protrusions 23 may have a shape similar to an upper half of an oblong ellipse. Because of the protrusion 23 having this shape, chips move smoothly on the diamond coating 17, resulting in low cutting force. This contributes to reducing frictional heat generated when the chips come into contact with the protrusions 23.

In cases where the protrusions 23 that are located in the first region 19 and have an equivalent circle diameter of 6 μm or more as viewed from directly above the first region 19 are first protrusions 23a in the present specification. The protrusions 23 that are located in the second region 21 and have an equivalent circle diameter of 6 μm or more as viewed from directly above the second region 21 are second protrusions 23b. In FIG. 2, though the protrusions 23 are located only on the first surface 5, the protrusions 23 may also be located on the second surface 7.

The number of the first protrusions 23a per 1 mm$^2$ is a first protrusion number 23an. The number of the second protrusions 23b per 1 mm$^2$ is a second protrusion number 23bn. The first protrusion number 23an of the coated tool 1 in the present disclosure is 30 or less. The second protrusion number 23bn of the coated tool 1 in the present disclosure is larger than the first protrusion number 23an.

With this configuration, the first protrusion number 23an per unit area is relatively small in the first region 19 located near the cutting edge 13, and a machined surface of a workpiece machined by the coated tool 1 becomes smooth. Additionally, because the second protrusion number 23bn is relatively large in the second region 21 located away from the cutting edge 13, frictional heat generated when chips come into contact with the protrusions 23 can be reduced to ensure that the coated tool 1 has excellent cooling properties and enhanced wear resistance. The coated tool 1 of the present disclosure has both the first region 19 and the second region 21 thus configured, and the coated tool 1 is therefore capable of smoothly machining a surface of a workpiece to be machined, thereby offering excellent machining properties. The coating (diamond coating 17) has excellent peeling resistance, thus leading to a long tool life.

The machined surface of the workpiece can be made smoother with a smaller first protrusion number 23an. The first protrusion number 23an may be 20 or less in the coated tool 1 of the present disclosure. More preferably, the first protrusion number 23an may be 10 or less. The first protrusion number 23an may be zero.

The second protrusion number 23bn may be not less than 5 times the first protrusion number 23an in the coated tool 1 of the present disclosure. The coated tool 1 including this configuration has smooth machinability and excellent tool life. Alternatively, the second protrusion number 23bn may be not more than 8 times the first protrusion number 23an.

The equivalent circle diameter of the protrusions 23 may be measured with, for example, a laser microscope (VK-X1000) manufactured by Keyence Corporation. The surface of the diamond coating 17 may be magnified 20-500 times to carry out measurement. An area of 0.1 mm$^2$ or more may be measured to determine the first protrusion number 23an and the second protrusion number 23bn.

<Method for Manufacturing Coated Tool>

A method for manufacturing a coated tool in the present disclosure is described below. Firstly, a base body is prepared. For example, cemented carbide and cermet are usable for the base body.

The base body is then subjected to etching treatment in the order of acid treatment and alkali treatment. The base body after subjected to the etching treatment is then subjected to ultrasonic treatment by immersing the base body in a dispersion of diamond particles. By carrying out these steps, it is possible to increase density of diamond particles obtained on the base body by deposition, thereby obtaining the diamond coating having good adhesion.

By carrying out the ultrasonic treatment for a relatively long period of time, ruggedness can be formed on a main crystal phase of a hard material exposed on the surface of the base body, and anchor effect is likely to occur, thereby further enhancing adhesion.

Diamond powder added to an ultrasonic treatment solution may have a mean particle diameter of 0.005 μm (5 nm) to 15 μm, which is measured with a laser scattering method. If the mean particle diameter of the diamond powder is 0.1 μm or less, a total number of the protrusions decreases. Diamond powder having a mean particle diameter of 0.1 μm (100 nm) or more but 15 μm or less is inexpensive to reduce manufacturing costs.

Here, 2-12 g of the diamond powder may be added to an organic based or water based solution 1 l (liter). The number of the first protrusions being present in the first region and the number of the second protrusions being present in the second region can be controlled by controlling the mean particle diameter and amount of the diamond powder included in the solution as described above.

For example, if the amount of the diamond powder is 8 g/l or less, the number of the first protrusions is relatively small. If the amount of the diamond powder exceeds 12 g/l, the number of the first protrusions is relatively large. If the amount of the diamond powder is less than 2 g/l, the second protrusions cannot be formed sufficiently.

Ultrasonic wave application time may be approximately 15 minutes to four hours. In particular, the coating has excellent adhesion if the ultrasonic wave application time is two hours or more.

By controlling deposition conditions described later in addition to the amount of the diamond powder, it is possible to control the number of the first protrusions being present in the first region and the number of the second protrusions being present in the second region.

For example, hot filament method or plasma method in CVD method is applicable as a deposition method for the diamond coating. In order to obtain protrusions having an approximately hemispheric shape, deposition time may be 10 hours or more.

In the CVD method, the base body is put in a chamber, the base body is heated to a temperature of approximately 850-930° C., and a deposition gas is circulated in the chamber. The deposition gas includes, for example, hydrogen gas and methane gas.

A period of time during which the base body is heated to 850-930° C. and the deposition gas is circulated is called deposition time. Because the protrusions in the diamond coating become larger as the deposition time becomes longer, it is easy to obtain the coated tool including the first protrusions and the second protrusions.

The protrusions can become larger in a short deposition time as the means particle diameter of the diamond powder becomes larger. For example, in cases where the diamond powder has a mean particle diameter of 0.005 μm (5 nm) to 10 μm, the coated tool of the present disclosure is obtainable by setting the deposition time to approximately 10-20 hours.

<Cutting Tools>

Figure 3:
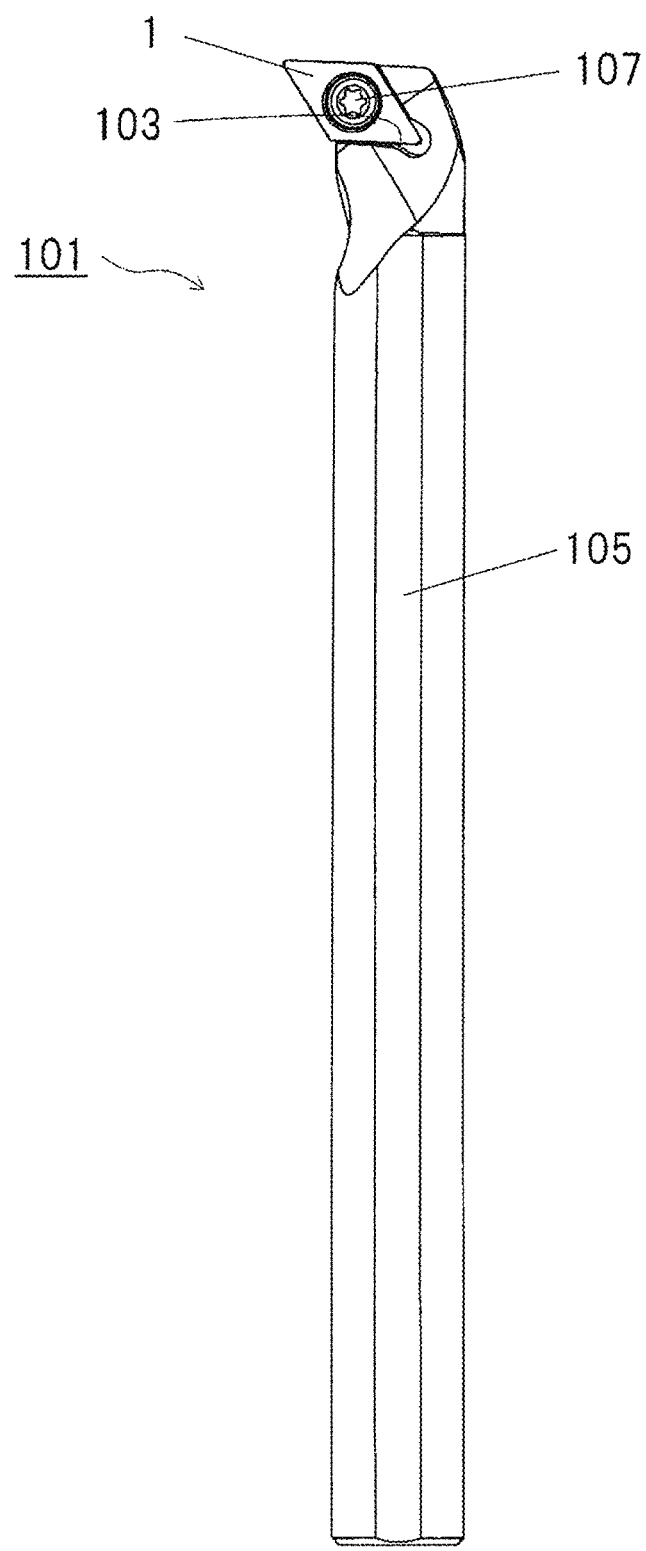
FIG. 3 is a plan view illustrating an embodiment of cutting tools in the present disclosure.

A cutting tool of the present disclosure is described below with reference to the drawings. As illustrated in FIG. 3, the cutting tool 101 of the present disclosure is, for example, a bar-shaped body extended from a first end (an upper end in FIG. 3) toward a second end (a lower end in FIG. 3). As illustrated in FIG. 3, the cutting tool 101 includes a holder 105 with a pocket 103 located on a side of the first end (a front end), and the above coated tool 1 located in the pocket 103.

A clamp 107 is inserted into the through hole 9 of the coated tool 1. The cutting tool 101 including the coated tool 1 of the present disclosure ensures a stable cutting process for a long period of time.

The pocket 103 is a part that permits attachment of the coated tool 1. The pocket 103 includes a seating surface parallel to a lower surface of the holder 105, and a constraining lateral surface inclined relative to the seating surface. The pocket 103 opens into a side of the first end of the holder 105.

The coated tool 1 is located in the pocket 103. The lower surface of the coated tool 1 may be in a direct contact with the pocket 103. Alternatively, a sheet (not illustrated) may be held between the coated tool 1 and the pocket 103.

The coated tool 1 is attached to the holder 105 so that at least a part of a portion used as the cutting edge 13 on a ridgeline where the rake surface intersects with the flank surface is protruded outward from the holder 105. The coated tool 1 may be attached to the holder 105 by a screw instead of the clamp 107. Specifically, the coated tool 1 may be attached to the holder 105 in such a manner that screw parts are engaged with each other by inserting the screw into the through hole 9 of the coated tool 1, and by inserting a front end of the screw into a screw hole (not illustrated) formed in the pocket 103.

For example, steel and cast iron are usable as a material of the holder 105. Of these materials, highly rigid steel may be used.

FIG. 3 illustrates the cutting tool 101 for use in a so-called turning process. Examples of the turning process include inner diameter machining, outer diameter machining, grooving process and end surface machining. The cutting tool 101 is not limited to one which is used for the turning process. For example, the coated tool 1 of the above embodiment may be used for a cutting tool used in a milling process.

Figure 4:
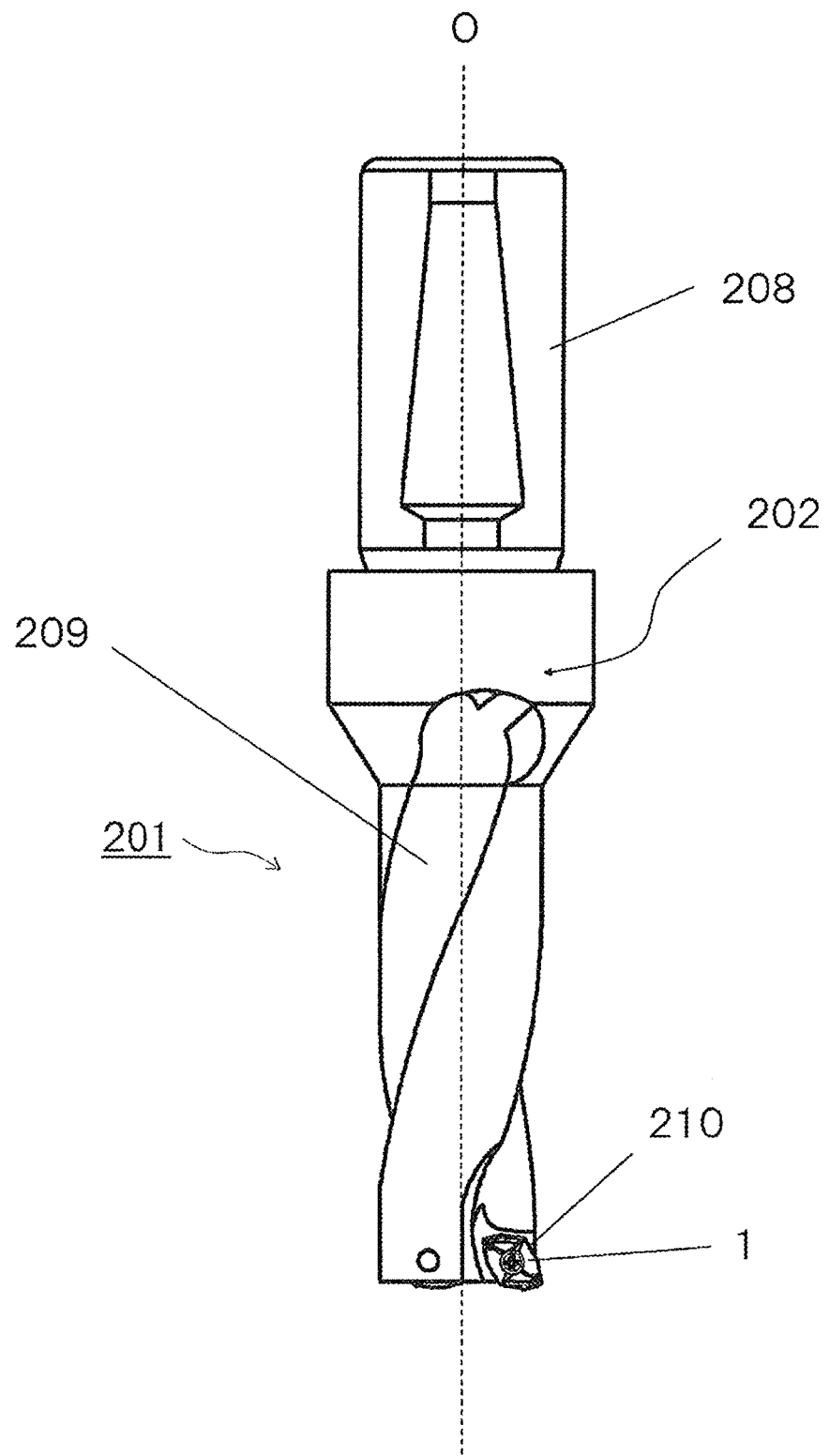
FIG. 4 is a plan view illustrating an embodiment of the cutting tools in the present disclosure.

The cutting tool of the present disclosure is described on the basis of an embodiment of indexable insert drills as a suitable embodiment of the cutting tool. FIG. 4 is a schematic side view illustrating the indexable insert drill 201 that is the cutting tool 201. As illustrated in FIG. 4, the indexable insert drill 201 is obtained by attaching the coated tool 1 to a front end part of a tool body 202 (holder) whose center is the rotation axis O.

The holder 202 has an approximately columnar shape and has the rotation axis O indicated by a broken line in FIG. 4. The holder 202 includes, on a side of a rear end thereof, a shank part 208 configured to fix the holder 202 to a tool machine, and a chip discharge flute 209 spirally formed on a side closer to a front end of the holder 202 than the shank part 208 in order to discharge chips from the front end to the rear end. A pocket 210 is disposed at a front end part of the holder 202, and the coated tool 1 is attached to the pocket 210.

A workpiece (not illustrated) is machined by rotating the indexable insert drill 201.

Figure 5:
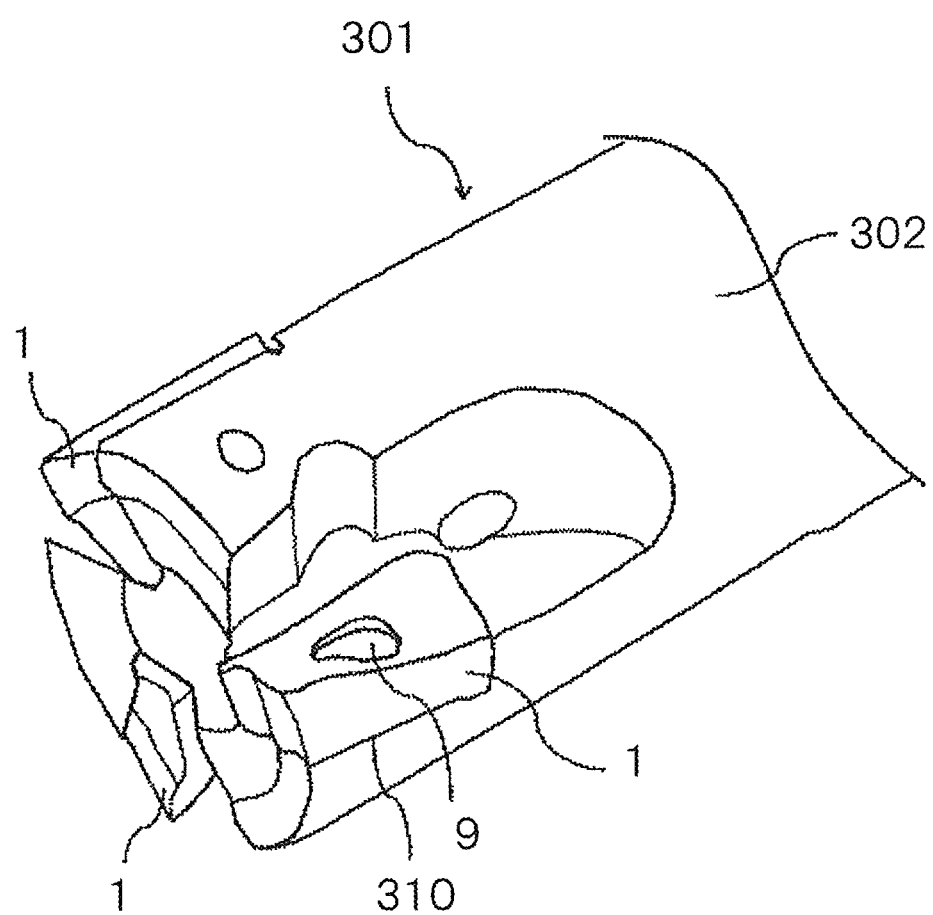
FIG. 5 is a diagram illustrating an embodiment of the cutting tools in the present disclosure, specifically, a perspective view in which a front end thereof is enlarged.

FIG. 5 illustrates a cutting tool 301 for the milling process. The coated tool 1 is attached to a pocket 310 formed in a holder 302. Three coated tools 1 are attached to a front end of the holder 302 in this embodiment.

EXAMPLES

The coated tool of the present disclosure is described below. A base body was manufactured as follows. To tungsten carbide (WC) powder having a mean particle diameter of 0.5 μm, 10 mass % of metal cobalt (Co) powder, 0.2 mass % of titanium carbide (TiC) powder and 0.8 mass % of chromium carbide ($Cr_3C_2$) powder were added in their respective amounts and mixed together. A mixture thus obtained was molded into a rectangular shape, followed by sintering.

Thereafter, a sintered body was washed with distilled water-organic solution. The base body was then subjected to etching treatment in the order of acid treatment and alkali treatment, and Co metal on an outermost layer was removed.

Subsequently, the base body was immersed in an organic solution obtained by adding the diamond powder having a mean particle diameter presented in Table 1 at the concentration presented in Table 1, and ultrasonic wave was applied thereto for three hours. Thereafter, the organic solution on the surface of the base body was removed and dried.

Deposition was conducted on the base body after being subjected to these steps for deposition time presented in Table 1. A mixed gas of hydrogen gas and methane gas was used as deposition gas. The methane gas was mixed in an amount of 0.5-2.0 vol % relative to the total volume of the mixed gas.

After the deposition, Sample No. 8 presented in Table 1 was subjected to surface polishing process by brush polishing process.

The first region and the second region of the coated tool thus obtained were magnified 500 times to observe protrusions located in each of these regions. Table 1 shows the number of the first protrusions and the number of the second protrusions.

The obtained coated tool was put in the pocket and fixed thereto, and a cutting test by the milling process was conducted under the following conditions. After the test, machined surface roughness of the workpiece was also evaluated.

<Cutting Test>

Cutting method: Shoulder milling (milling process)

Workpiece: ADC12

Cutting Speed: 800 m/min

Feed rate: 0.08 mm/tooth

Vertical cutout: 1.5 mm

Lateral cutout: 15 mm

Cutting state: Wet

Evaluation method: The presence or absence of peeling of the diamond coating at the cutting edge of the coated tool was checked, and machined surface roughness of the workpiece was measured at a point in time that a cutting length reached 100 m.

TABLE 1

| Sample No. | Mean particle diameter of diamond powder (μm) | Diamond powder concentration (g/l) | Deposition time (h) | Surface polishing process | Existence of first protrusion | First protrusion number (/mm²) | Existence of second protrusion | Second protrusion number (/mm²) | Evaluation result of life | Machined surface roughness Ra [μm] |
|---|---|---|---|---|---|---|---|---|---|---|
| 1 | 0.01 | 1 | 20 | Not proceeded | Absent | 0 | Absent | 0 | Fracture | 9.1 |
| 2 | 0.01 | 6 | 10 | Not proceeded | Present | 3 | Present | 14 | with peeling (small) | 0.53 |
| 3 | 0.01 | 6 | 20 | Not proceeded | Present | 5 | Present | 40 | without peeling | 0.32 |
| 4 | 10 | 6 | 10 | Not proceeded | Present | 7 | Present | 30 | with peeling (small) | 0.59 |
| 5 | 10 | 6 | 20 | Not proceeded | Present | 11 | Present | 78 | without peeling | 0.38 |
| 6 | 10 | 6 | 45 | Not proceeded | Present | 260 | Present | 980 | with peeling chipping | 1.67 |
| 7 | 10 | 12 | 10 | Not proceeded | Present | 28 | Present | 92 | with peeling (small) | 0.65 |
| 8 | 10 | 12 | 20 | Proceeded | Absent | 0 | Absent | 0 | Fracture | 6.8 |
| 9 | 10 | 12 | 20 | Not proceeded | Present | 52 | Present | 78 | with peeling chipping | 0.82 |
| 10 | 10 | 12 | 45 | Not proceeded | Present | 260 | Present | 1000 | with peeling chipping | 1.87 |
| 11 | 10 | 25 | 10 | Not proceeded | Present | 94 | Present | 370 | with peeling chipping | 1.3 |
| 12 | 10 | 25 | 20 | Not proceeded | Present | 124 | Present | 310 | with peeling chipping | 1.47 |
| 13 | 10 | 25 | 45 | Not proceeded | Present | 800 | Present | 1700 | with peeling chipping | 2.1 |

In Samples Nos. 1, 6, 8, 9, 10, 11, 12 and 13, each of which does not include the configuration of the coated tool of the present disclosure, abnormal damages, such as large film peeling, chipping and fracture, occurred during the milling process. A machined surface of the workpiece became clouded and surface roughness deteriorated. In the coated tools of the present disclosure in Samples Nos. 2, 3, 4, 5 and 7, abnormal damages, such as fracture and chipping, were reduced and the surface roughness of the machined surface was good. Although Samples Nos. 2, 4 and 7 caused peeling, the peeling was observed in an extremely small region. Samples Nos. 3 and 5 caused no film peeling, and surface roughness was Ra=0.5 μm or less, thus offering excellent cutting performance.

The coated tool and the cutting tool including the coated tool in the present disclosure described above are some embodiments, and these may include a different configuration without departing from the scope of the present application.

DESCRIPTION OF THE REFERENCE NUMERAL 1 coated tool
5 first surface
7 second surface
9 through hole
11 ridgeline
13 cutting edge
15 base body
17 diamond coating (diamond layer)
19 first region
21 second region
23 protrusion
23a first protrusion
23an first protrusion number
23b second protrusion
23bn second protrusion number
101, 201, 301 cutting tool
103, 210, 310 pocket
105, 202, 302 holder
107 clamp

The invention claimed is:
1. A coated tool, including:
a base body, and
a diamond coating located on the base body,
the coated tool comprising
a first surface,
a second surface,
a ridgeline part located between the first surface and the second surface, and
a cutting edge located at the ridgeline part, wherein
the first surface comprises
a first region located within 300 μm from the cutting edge, and
a second region whose distance from the cutting edge ranges between 300-800 μm,
the diamond coating is located on at least the first region and the second region,
the diamond coating comprises an outer surface having dome-shaped protrusions,
the protrusions comprises
first protrusions having an equivalent circle diameter of 6 μm or more located in the first region as viewed from directly above the first region, and
second protrusions having an equivalent circle diameter of 6 μm or more located in the second region as viewed from directly above the second region,
a number of the first protrusions per 1 mm2 is a first protrusion number,
a number of the second protrusions per 1 mm2 is a second protrusion number, the first protrusion number is 30 or less, and
the second protrusion number is larger than the first protrusion number.

2. The coated tool according to claim 1, wherein the first protrusion number is 20 or less.

3. The coated tool according to claim 1, wherein the second protrusion number is 5 times or more than the first protrusion number.

4. A cutting tool, comprising:
a holder which has a length from a first end to a second end and comprises a pocket located on a side of the first end; and
the coated tool according to claim 1, the coated tool being located in the pocket.

* * * * *